US010712768B2

(12) United States Patent
Musunuri et al.

(10) Patent No.: US 10,712,768 B2
(45) Date of Patent: *Jul. 14, 2020

(54) APPARATUS AND METHOD FOR EXTENDING FREQUENCY RANGE OF A CIRCUIT AND FOR OVER-CLOCKING AND UNDER-CLOCKING

(71) Applicant: Intel Corporation, Santa Clara, CA (US)

(72) Inventors: Surya Musunuri, Folsom, CA (US); Jagannadha R. Rapeta, Folsom, CA (US); Mark L. Elzinga, El Dorado, CA (US); Young Min Park, Folsom, CA (US); Robert R. Fulton, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/252,471

(22) Filed: Jan. 18, 2019

(65) Prior Publication Data
US 2019/0220054 A1    Jul. 18, 2019

Related U.S. Application Data

(63) Continuation of application No. 14/917,928, filed as application No. PCT/US2013/072924 on Dec. 3, 2013, now Pat. No. 10,185,349.

(51) Int. Cl.
*G06F 1/00* (2006.01)
*G06F 1/08* (2006.01)
(Continued)

(52) U.S. Cl.
CPC ............... *G06F 1/08* (2013.01); *G06F 13/36* (2013.01); *G06F 13/4068* (2013.01); *H03L 7/183* (2013.01); *H03L 2207/50* (2013.01)

(58) Field of Classification Search
None
See application file for complete search history.

(56) References Cited

U.S. PATENT DOCUMENTS 5,977,836 A   11/1999  Swan et al.
6,081,164 A    6/2000  Shigemori et al.
(Continued)

FOREIGN PATENT DOCUMENTS

CN        1613812        5/2005

OTHER PUBLICATIONS

International Preliminary Report on Patentability, dated Jun. 16, 2016, for PCT Patent Application No. PCT/US2013/072924.
(Continued)

*Primary Examiner* — Nitin C Patel
(74) *Attorney, Agent, or Firm* — Green, Howard, & Mughal LLP

(57) ABSTRACT

Described is an apparatus for over-clocking or under-clocking, the apparatus comprises: a locked loop (e.g., phase locked loop or frequency locked loop) having a feedback divider, the locked loop to receive a reference clock and to compare it with a feedback clock which is output from the feedback divider, and to generate an output clock; a post locked loop divider, coupled to the locked loop, to receive the output clock and to generate a base clock for other logic units; and a control logic to adjust first and second divider ratios for the feedback divider and the post locked loop divider respectively for over-clocking or under-clocking the base clock such that the locked loop remains locked while being over-clocked or under-clocked.

20 Claims, 9 Drawing Sheets

(51) Int. Cl.
  *H03L 7/183*   (2006.01)
  *G06F 13/36*   (2006.01)
  *G06F 13/40*   (2006.01)

(56) References Cited

U.S. PATENT DOCUMENTS

| | | | |
|---|---|---|---|
| 7,026,878 B2 | 4/2006 | Smith | |
| 7,298,218 B2 | 11/2007 | Ghazali et al. | |
| 7,436,227 B2 | 10/2008 | Thomsen et al. | |
| 8,779,812 B1 * | 7/2014 | Kavanagh | H03L 7/087 327/150 |
| 2004/0215995 A1 | 10/2004 | Tomerlin et al. | |
| 2005/0046491 A1 | 3/2005 | Smith | |
| 2009/0140782 A1 * | 6/2009 | Huang | H03K 23/68 327/156 |
| 2009/0261910 A1 | 10/2009 | Locker | |
| 2010/0077248 A1 * | 3/2010 | Wu | G06F 1/08 713/500 |
| 2011/0273210 A1 | 11/2011 | Nagaraj | |
| 2013/0070832 A1 | 3/2013 | Chu | |

OTHER PUBLICATIONS

International Search Report and Written Opinion from PCT/US2013/072924 notified Sep. 18, 2014, 6 pgs.
Non-Final Office Action from Chinese Patent Application No. 201380080530.5 notified Dec. 25, 2018, 8 pgs.
Non-Final Office Action from Chinese Patent Application No. 201380080530.5 notified Sep. 21, 2018, 13 pgs.
Non-Final Office Action from Chinese Patent Application No. 20180080530.5 notified Jan. 24, 2018, 17 pgs.
Non-Final Office Action from Korean Patent Application No. 10-2016-7010259 notified Oct. 16, 2017, 8 pgs.
Non-Final Office Action from U.S. Appl. No. 14/917,928 notified Apr. 18, 2018, 17 pgs.
Notice of Allowance from Korean Patent Application No. 10-2016-7010259 notified May 28, 2018, 3 pgs.
Notice of Allowance from U.S. Appl. No. 14/917,928 notified Sep. 14, 2018, 8 pgs.

* cited by examiner

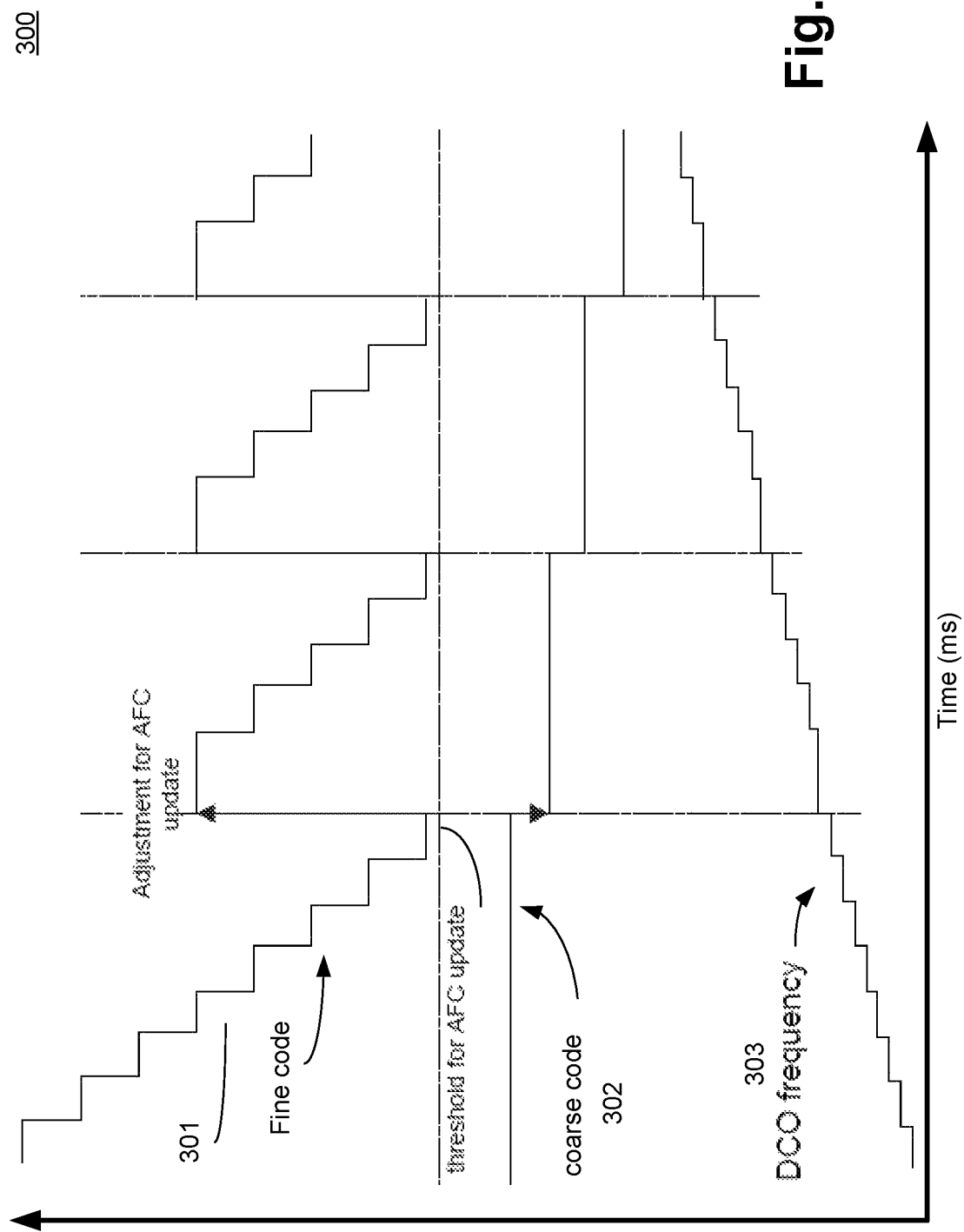

600

| Sawtooth # | N_FBDIV_BASE | N_PDDIV_BASE | N_PDDIV_TOP | N_FBDIV_TOP | ROUND(N_FBDIV_TOP) | Ideal PDDIV TOP O/P Frequency (MHz) | Actual PDDIV TOP O/P Frequency (MHz) | Period mismatch (ps) | Ramp height DCO Frequency (MHz) | # FBDIV cycles | # PDDIV cycles | Common factor |
|---|---|---|---|---|---|---|---|---|---|---|---|---|
| 1 | 150 | 36 | 36 | 150 | 150 | 100 | 100 | 0 | 0 | 6 | 25 | |
| 2 | 150 | 32 | 36 | 168.75 | 169 | 112.5 | 112.67 | 13.15 | 456 | 36 | 169 | 1 |
| 3 | 150 | 31 | 32 | 154.83 | 155 | 116.13 | 116.25 | 8.96 | 120 | 32 | 155 | 1 |
| 4 | 150 | 27 | 31 | 172.22 | 172 | 133.33 | 133.16 | -9.69 | 528 | 31 | 172 | 1 |
| 5 | 150 | 24 | 27 | 168.75 | 169 | 150 | 150.22 | 9.86 | 456 | 27 | 169 | 1 |
| 6 | 150 | 23 | 24 | 156.52 | 157 | 156.52 | 157 | 19.46 | 168 | 24 | 157 | 1 |
| 7 | 150 | 22 | 23 | 156.82 | 157 | 163.63 | 163.82 | 7.08 | 168 | 23 | 157 | 1 |
| 8 | 150 | 21 | 22 | 157.14 | 157 | 171.42 | 171.27 | -5.31 | 168 | 22 | 157 | 1 |
| 9 | 150 | 20 | 21 | 157.5 | 158 | 180 | 180.57 | 17.58 | 192 | 21 | 158 | 1 |
| 10 | 150 | 18 | 20 | 166.67 | 167 | 200 | 200.4 | 9.98 | 408 | 20 | 167 | 1 |
| 11 | 150 | 16 | 18 | 168.75 | 169 | 225 | 225.33 | 6.57 | 456 | 18 | 169 | 1 |
| 12 | 150 | 14 | 16 | 171.43 | 171 | 257.14 | 256.5 | -9.75 | 504 | 16 | 171 | 1 |

Fig. 6

APPARATUS AND METHOD FOR EXTENDING FREQUENCY RANGE OF A CIRCUIT AND FOR OVER-CLOCKING AND UNDER-CLOCKING

CLAIM FOR PRIORITY

This application is a continuation of, and claims priority to, U.S. patent application Ser. No. 14/917,928, filed on 9 Mar. 2016, titled "APPARATUS AND METHOD FOR EXTENDING FREQUENCY RANGE OF A CIRCUIT AND FOR OVER-CLOCKING OR UNDER-CLOCKING", which is a National Stage Application under 35 U.S.C. § 371 and claims priority to PCT Patent Application Serial No. PCT/US2013/072924, filed on 3 Dec. 2013, titled "APPARATUS AND METHOD FOR EXPENDING FREQUENCY RANGE OF A CIRCUIT AND FOR OVER-CLOCKING OR UNDER-CLOCKING," and which is incorporated by reference in entirety.

BACKGROUND

Platform over-clocking solutions provide performance enhancements for high end desktop and server processor products. Over-clocking is the process of making a computer or component operate faster than a clock frequency specified by the manufacturer by modifying system parameters. A key ingredient to over-clocking solutions is a low-jitter over-clockable base clock for the processor cores (e.g., in a multi-core processor) and memory controllers. For example, the frequency of a base clock is slowly increased from 100 MHz until the platform hits its thermal and operational limits. The platform is then rebooted at this elevated base clock frequency to achieve performance improvements.

Typically, this base clock is generated using an LC-oscillator based Phase Locked Loop (PLL), which then provides multiple high frequency clock phases for phase interpolator or delay locked chain circuits to realize the over-clocking feature. Such implementations consume large silicon footprint along with power penalty (i.e., leakage and active power) during non-over-clocking operation of platforms. Ring oscillator based PLLs are also used to generate over-clockable base clocks, but these implementations usually give very poor clock jitter performance.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 3A illustrates a plot showing output of a digitally controlled oscillator (DCO) of the PLL of FIG. 2 with smooth over-clocking, according to one embodiment of the disclosure.

FIG. 6 illustrates a firmware (FW) programming sequence for Ramp-Jump over-clocking in which frequency range of the Base Clock is increased, according to one embodiment of the disclosure.

DETAILED DESCRIPTION

Figure 1:
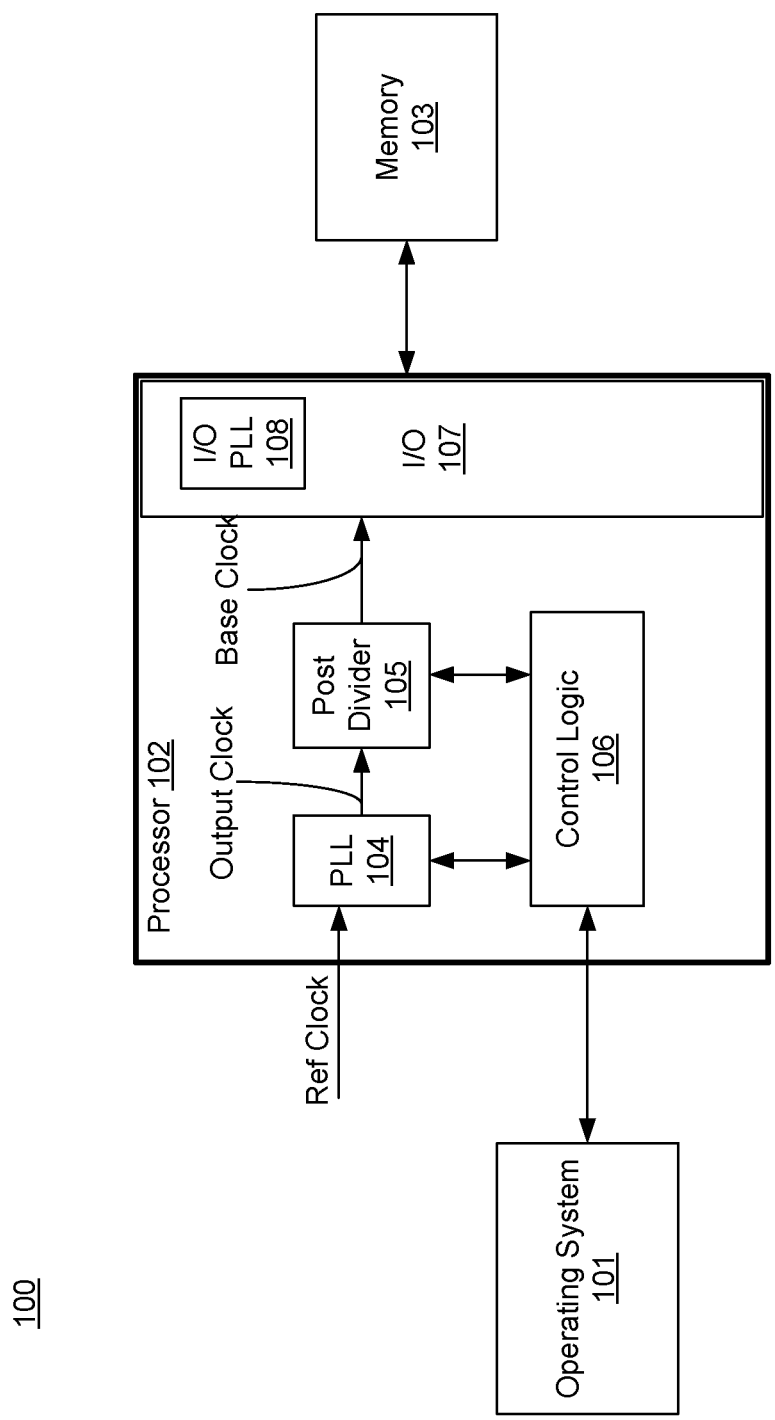
FIG. 1 illustrates a system with a processor having a Phase Locked Loop (PLL) which is operable to be over-clocked or under-clocked in a monotonic fashion without restarting the PLL, according to one embodiment of the disclosure.

The embodiments describe an apparatus for over-clocking or under-clocking. In one embodiment, the apparatus comprises: a locked loop (e.g., phase locked loop (PLL) or frequency locked loop (FLL)) having a feedback divider. In one embodiment, the locked loop receives a reference clock (Ref Clock) and compares it with a feedback clock (FB Clock) which is output from the feedback divider, and generates an output clock. In one embodiment, the apparatus comprises a post locked loop divider, coupled to the locked loop, to receive the output clock and to generate a base clock for other logic units. In one embodiment, the apparatus comprises a Control Logic to adjust first and second divider ratios for the feedback divider and the post locked loop divider respectively, for over-clocking or under-clocking the base clock such that the locked loop remains locked while being over-clocked or under-clocked.

In one embodiment, the apparatus provides a way to extend the usage of an LC-oscillator based digital PLL (e.g., LCPLL) for wide range (e.g., 50% or greater) over-clocking applications. In one embodiment, over-clocking feature is integrated into an LC-oscillator based digital PLL and a post divider, and obviates the need for additional circuits such as phase interpolator and/or delay locked loops (DLLs). The embodiments are operable to increase the over-clocking range of an LCPLL and provide a low-jitter alternative to ring oscillator based PLL. In one embodiment, the Control Unit provides suitable Firmware (FW) hooks for easier control and/or accessibility of the feature of over-clocking or under-clocking from operating system (OS) or software level.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The term "scaling" may also refer to adjusting (e.g., slow down) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFet transistors, Gate All Around Cylindrical Transistors or other devices implementing transistor functionality like carbon nano tubes or spintronic devices. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 illustrates a system 100 with a processor having a PLL which is operable to be over-clocked or under-clocked in a monotonic fashion without restarting the PLL, according to one embodiment of the disclosure. In one embodiment, system 100 comprises an Operating System 101, Processor 102, and Memory 103. In one embodiment, Processor 102 comprises PLL 104, Post Divider 105, Control Logic 106, Input-Outputs (I/Os) 107, and I/O PLL 108. So as not to obscure the embodiments, many components of Processor 102 are not shown. Processor 102 can be a digital signal processor (DSP), a general micro processor (CPU), Application Specific Integrated Circuit (ASIC), or any other processor.

In one embodiment, PLL 104 receives Ref Clock from an external source (e.g., crystal oscillator) and generates a phase or frequency locked Output Clock. In one embodiment, Output Clock is divided down or multiplied up by Post Divider 105 which generates Base Clock. In one embodiment, Base Clock is distributed by a clock distribution network to other parts of Processor 102. In one embodiment, Base Clock is used by I/O PLL 108 as a reference clock to generate an I/O Clock for I/Os 107. For example, Double Data Rate (DDR) 4 compliant I/O transmitters in I/Os 107 may operate using the I/O Clock to communicate with Memory 103.

In one embodiment, Operating System 101 is any known operating system which is operable to access and control registers of Control Logic 106. In this embodiment, Control Logic 106 is used to control over-clocking and/or under-clocking of Base Clock and such control can be managed by Operating System 101. In one embodiment, Control Logic 106 is operable to save (or store) normal operating conditions or parameters of PLL 104 before it begins to alter divider ratio (also referred here as first divider ratio) of PLL 104. In one embodiment, Control Logic 106 is also operable to modify divider ratio (also referred here as second divider ratio) for Post Divider 105. While the embodiments are explained with reference to PLL 104, they are also applicable to frequency locked loops (FLLs).

In one embodiment, when Operating System 101 indicates to Control Logic 106 that Base Clock is to be over-clocked, then Control Logic 106 takes a snapshot of operating conditions or parameters of PLL 104 when it is locked. In one embodiment, the snapshot is saved in registers accessible by Operating System 101. In one embodiment, the parameters include digital code for controlling the oscillating frequency of the oscillator of PLL 104, filter coefficients, etc.

In one embodiment, Control Logic 106 then increases divider ratio of feedback divider of PLL 104 to increase frequency of Output Clock in such a manner that PLL does not lose lock. In such an embodiment, divider ratio of feedback divider of PLL 104 is changed very slowly (e.g., in milliseconds), i.e., in small increments. For example, divider ratio changes ten to hundred times slower than bandwidth of PLL 104. In one embodiment, as Output Clock frequency changes, Base Clock frequency tracks the frequency change and also changes. In one embodiment, once Output Clock reaches a new frequency level, Control Logic 106 then slowly changes the divider ratio of the Post Divider 105 to increase frequency of Base Clock beyond its previous limitation set by previous divider ration for Post Divider 105. In one embodiment, frequency of Base Clock is changed slowly enough through change in divider ratio such that subsequent PLLs that use Base Clock as reference clock do not lose lock.

Figure 2:
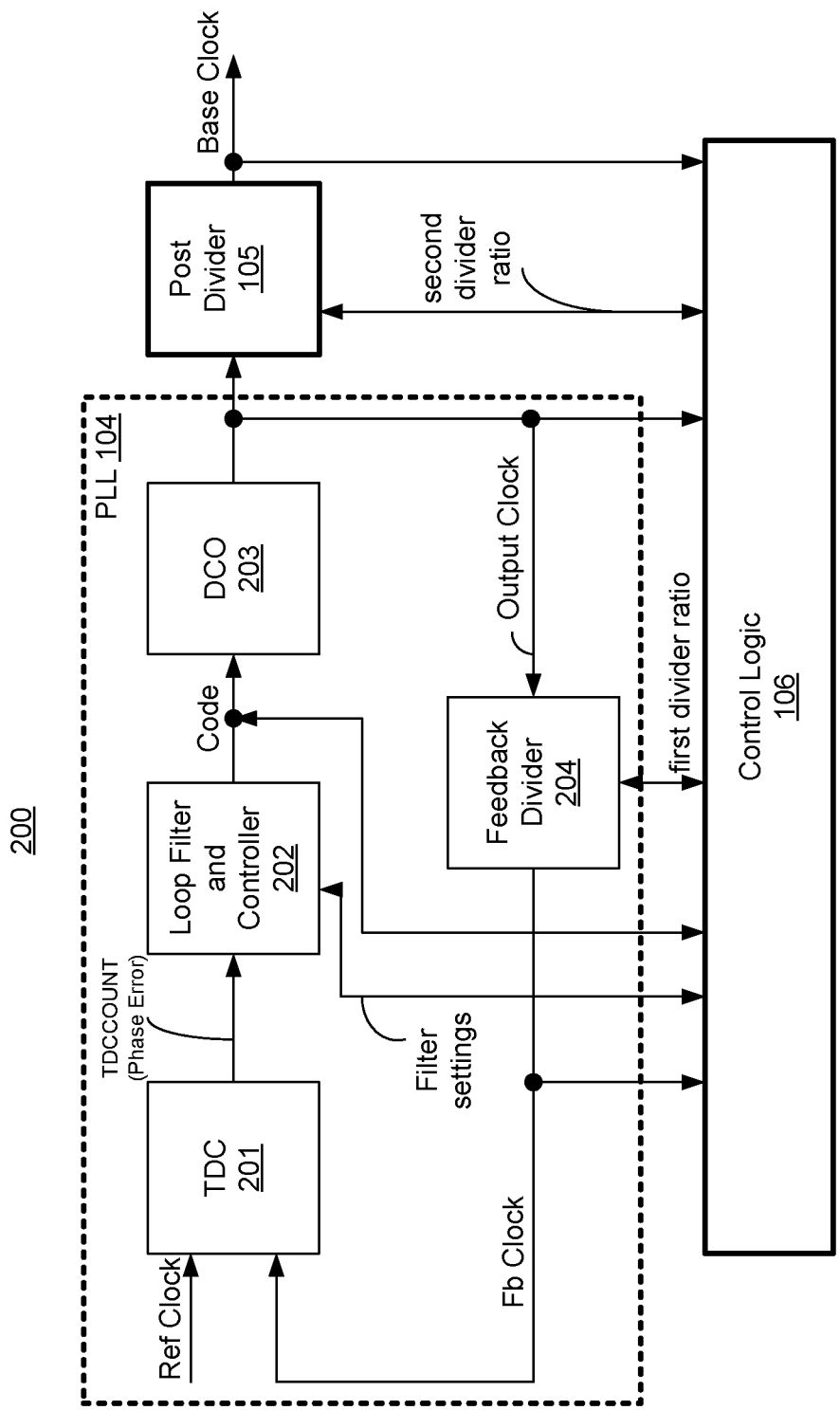
FIG. 2 illustrates a PLL and associated logic to over-clock or under-clock a Base Clock without restarting the PLL, according to one embodiment of the disclosure.

FIG. 2 illustrates an apparatus 200 with PLL (e.g., 104) and associated logic (e.g., Post Divider 105, Control Logic 106, etc.) to over-clock or under-clock a Base Clock without restarting the PLL, according to one embodiment of the disclosure. It is pointed out that those elements of FIG. 2 having the same reference numbers (or names) as the elements of any other figure can operate or function in any manner similar to that described, but are not limited to such.

In one embodiment, PLL 104 comprises a time-to-digital converter (TDC) 201, Loop Filter and/or Controller 202, DCO 203, and Feedback Divider 204 (also referred to as the first divider). In one embodiment, PLL 104 is a digital PLL. In one embodiment, TDC receives Ref Clock and Fb Clock to generate TDCCOUNT (i.e., phase error) that indicates whether DCO 203 should increase its oscillating frequency, reduce its oscillating frequency, or keep its oscillating frequency unchanged. In one embodiment, Loop Filter and/or Controller 202 generates a digital code (Code) which is used to set the oscillating frequency of DCO 203. In one embodiment, Loop Filter 202 filters any noise on the output of TDC 201. In one embodiment, Loop Filter 202 is a digital filter and its bandwidth is controllable by filter coefficients. In one embodiment, DCO 203 is an LC-DCO and generates Output Clock according to the Code i.e., frequency of Output Clock changes with changes to Code. In one embodiment, Feedback Divider 204 receives first divider ratio from Control Logic 106 and divides frequency of Output Clock to generate Fb Clock.

In one embodiment, Control Logic 106 is operable to control and/or save Filter settings of Loop Filter 202. For example, Control Logic 106 saves filter coefficients for Loop Filter 202. In one embodiment, Control Logic 106 is operable to control and/or save the Code for DCO 203. In one embodiment, Control Logic 106 is also operable to monitor the frequency and timing characteristics of Output Clock, Fb Clock, and Base Clock. In one embodiment, Control Logic 106 is operable to control and/or save first divider ratio for Feedback Divider 204. In one embodiment, Control Logic 106 is operable to control and/or save second divider ratio for Post Divider 105. In one embodiment, Control Logic 106 includes in itself or has access to registers that store operating conditions or parameters of PLL 104. In one embodiment, Operating System 101 is operable to access those registers.

The following embodiments are explained with reference to over-clocking the Base Clock, for example, to increase processing speed of processor. The same concepts can be used for under-clocking the Base Clock, for example, to save power consumption.

In one embodiment, Control Logic 106 takes a baseline "snapshot" of PLL 104. For example, upon initial phase lock of digital PLL 104 at nominal/base frequency, filter coefficients, the integral component of Loop Filter 202 and capacitance bank Code (in case of LC-DCO) are stored in storage elements. Together, these stored ("snapshot") values provide nominal frequency corresponding to DCO 203.

In one embodiment, Control Logic 106 begins the process of smooth over-clocking after saving the snapshot of PLL 104. In one embodiment, Control Logic 106 slowly increases frequency of Output Clock of PLL 104 by updating the first divider ratio. In one embodiment, Feedback Divider 203 is a fractional divider. In such an embodiment, Control Logic 106 updates the fractional feedback divider ratio in such a manner that PLL 104 remains locked. Operation of DCO 203 during smooth over-clocking is described with reference to FIG. 3A.

Referring back to FIG. 2, in one embodiment, second divider ratio for Post Divider 105 (that runs on PLL Output Clock to generate Base Clock for platform) is held constant by Control Logic 106 while Output Clock frequency increases. In one embodiment, feedback divider ratio (i.e., first divider ratio) is increased with a very small step size (e.g., step size of 0.10 or less). In one embodiment, once PLL 104 tracks the new first divider ratio, PLL 104 provides an update-ready indication to Control Logic 106 through another register. In one embodiment, this update-ready indication is accessible by Operating System 101.

In one embodiment, Control Logic 106 also tracks these ratio updates (i.e., updates to first and second divider ratios) and provides smooth transitions between consecutive Codes. In such an embodiment, fractional ratio update and smooth Code change together allow smooth over-clocking. For example, smooth over-clocking can occur up to 50% of nominal frequency for LC based DCO (limited by capacitance bank range), and is suitable for phase-tracking applications.

FIG. 3A illustrates a plot showing profile of DCO frequency (i.e., Output Clock) of FIG. 2 during over-clocking of Base Clock and Ramp-Jump for frequency range extension of the Base Clock, according to one embodiment of the disclosure. It is pointed out that those elements of FIG. 3A having the same reference numbers (or names) as the elements of any other figure can operate or function in any manner similar to that described, but are not limited to such.

Plot 300 shows three waveforms—301 to 303. The first waveform 301 from the top is the Fine Code change. The second waveform 302 from the top is Coarse Code. The third waveform 303 from the top is DCO frequency. Code for controlling DCO 203 includes Fine Code and Course Code. Fine code is small step sizes within a Coarse Code window. In one embodiment, Fine Code controls lower hierarchy of capacitors in LC-DCO while Coarse Code controls higher hierarchy of capacitors in LC-DCO. For example, when Coarse Code changes, capacitance of LC-DCO changes by a larger amount than when a Fine Code changes. Change in capacitance in LC-DCO changes oscillating frequency of LC-DCO.

In one embodiment, when first divider ratio changes by a small step, Loop Filter and/or Controller 202 observe a very small change in output of TDC 201 and so cause a small step size change in Fine Code as shown in waveform 301. As Fine Code changes, DCO frequency changes which is shown by waveform 303. In one embodiment, when Fine Code reaches its boundary within a Course Code window, Course Code is allowed by Controller 202 to change to next Coarse Code. The change to the next Coarse Code is effectively the same capacitance code as the capacitance code for the previous step when Fine Code reached the boundary of Coarse Code. In such an embodiment, DCO frequency remains constant for a period of fine step size change as shown by waveform 303. Overtime, both Fine Codes and Coarse Codes continue to update to increase the DCO frequency (i.e., frequency of Output Clock) slowly (e.g., in milliseconds) to reach the target frequency based on the updated first divider ratio.

Referring back to FIG. 2, in one embodiment, as Output Clock frequency increases, Base Clock frequency increases. In one embodiment, after Output Clock reaches the desired frequency, Control Logic 106 updates the second divider ratio to extend the frequency range of Base Clock i.e., Ramp-Jump over-clocking. In such an embodiment, Control Logic 106 monitors the frequency of Output Clock and when it determines that it has reached the target frequency based on the updated first divider ratio, Control Logic 106 then updates the second divider ratio. In such an embodiment, Base Clock is allowed to increase in frequency in a continuous monotonic fashion using the updated second divider ratio so that subsequent PLLs (e.g., PLL 108) remain locked while Base Clock frequency changes. In one embodiment, second divider ratio is an integer ratio while the first divider ratio is either fraction number or an integer.

In one embodiment, the stored integral and Code components or parameters that represent the base (or nominal frequency) of PLL 104 are re-applied by Control Logic 106 for PLL 104. In one embodiment, the stored "snapshot" is re-applied by Control Logic 106 in conjunction with a synchronized divider ratio update to Post Divider 105 i.e., the previously stored first divider ratio is applied to Feedback Divider 204 in synchronization with an updated second divider ratio for Post Divider 105. In such an embodiment, the frequency of Output Clock is reduced back to its nominal frequency, while the second divider ratio is simultaneously increased such that the frequency of Base Clock is unchanged i.e.:

N_FBDIV_TOP/N_PDDIV_TOP=N_FBDIV_BASE/ N_PDDIV_BASE where "TOP" indicates ratios before the frequency jump, while "BASE" indicates ratios after the frequency jump.

Figure 3B:
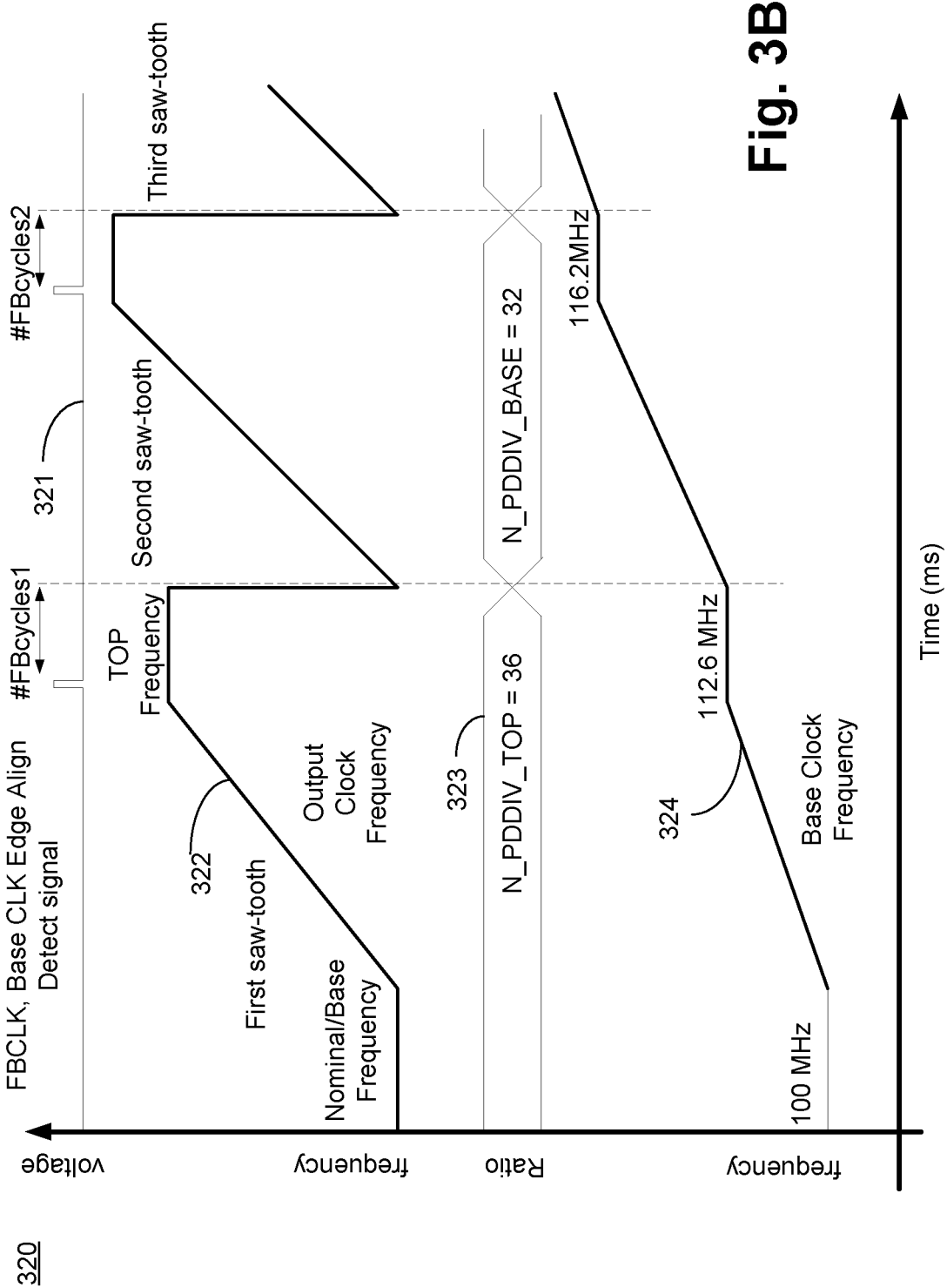
FIG. 3B illustrates a plot showing profile of DCO of FIG. 2 during over-clocking of Base Clock and Ramp-Jump for frequency range extension of the Base Clock, according to one embodiment of the disclosure.

FIG. 3B illustrates a plot 320 showing profile of DCO of FIG. 2 during over-clocking of Base Clock and Ramp-Jump for frequency range extension of the Base Clock, according to one embodiment of the disclosure. It is pointed out that those elements of FIG. 3B having the same reference numbers (or names) as the elements of any other figure can operate or function in any manner similar to that described, but are not limited to such.

Plot 320 shows four waveforms—321 to 324. First waveform from the top is waveform 321 which is an output of an edge detector circuit (described with reference to FIGS. 4A-B). Referring back to FIG. 3B, in one embodiment, output of edge detector circuit indicates when Fb Clock and Base Clock edges align. In one embodiment, the pulse in waveform 321 indicates when Fb Clock and Base Clock edges align. In such an embodiment, after predetermined number of Base Clock cycles, Control Logic 106 performs the frequency jump operation where the previously stored snapshot is re-applied to PLL 104 as discussed above.

Second waveform 322 from top is the DCO clock frequency (i.e., Output Clock) in time domain. Waveform 322 can also be analyzed as being the first divider ratio. The lower flat region of the waveform is the nominal or base frequency of Output Clock when PLL 104 is locked in normal operation. In this region, the first divider ratio is fixed i.e., constant. The ramped Output Clock frequency is observed when first divider ratio is updated while keeping the second divider ratio constant. A zoomed version of Output Clock is shown with reference to FIG. 3A. Referring back to FIG. 3B, the higher flat region of waveform 322 is the TOP frequency which is the target frequency achieved from updated first divider ratio.

In one embodiment, after predetermined edges of Base Clock, Control Logic 106 re-applies the stored snapshot parameters back to PLL 104 so it may operate at the same nominal base frequency. The second saw-tooth wave in waveform 322 shows the step in Output Clock frequency back to nominal frequency. In another embodiment, after predetermined edges of Base Clock, Control Logic 106 re-applies a modified version of stored snapshot parameters back to PLL 104 so it may operate at the slightly higher frequency than nominal base frequency as discussed with reference to FIG. 3C. In such an embodiment, frequency of Base Clock is increased but the step size of that increment is small enough that PLL 104 remains phase locked.

Referring back to FIG. 3B, in one embodiment, to arrive at a periodic alignment of Fb Clock and Base Clock edges for synchronized ratio updates, N_FBDIV_TOP is rounded to nearest integer, while N_FBDIV_BASE is chosen to be a fixed integer by Control Logic 106. Here, "N_FBDIV_TOP" is the first divider ratio for achieving target frequency which is higher than the nominal frequency of Output Clock, and "N_FBDIV_BASE" is the first divider ratio for nominal frequency for Output Clock. In such an embodiment, this rounding leads to cycle-to-cycle Base Clock jitter (which can be optimized against DCO settling time) expressed by:

N_PDDIV_TOP(1/N_FBDIV_TOP−1/ROUND (N_FBDIV_TOP))/Fref, where Fref is the frequency of Ref Clock which is input to PLL 104, and where "N_PDDIV_TOP" is the second divider ratio for achieving the over-clocked frequency for Base Clock. In one embodiment, with the chosen first divider ratio before jump (i.e., ROUND(N_FBDIV_TOP)), Fb Clock (i.e., FBCLK) and Base Clock rising edges align every Fb Clock cycles (i.e., Fbcycles), which is expressed as:

Fbcycles=LCM(N_PDDIV_TOP,ROUND (N_FBDIV_TOP))/ROUND(N_FBDIV_TOP) FBCLK cycles, where "LCM" is Least Common Multiple.

In one embodiment, at the TOP region of the Output Clock frequency ramp of waveform 322, once the first alignment between Fb Clock and Base clock edges is detected by the edge alignment circuit, this periodicity number can be used by Control Logic 106 to prepare for DCO 203, Feedback Divider 204 and Post Divider 105 ratio updates. The embodiments extend the range of over-clocking well above 50% of nominal frequency for non-phase tracking applications.

Third waveform 323 from the top shows the post divider ratio change (i.e., change in second divider ratio). In this example, the second divider ratio changes from 36 to 32 between the first and second saw-tooth waveforms of waveform 322 i.e., to achieve TOP frequency in the first saw-tooth of waveform 322, second divider ratio is 36 and when the second saw-tooth of waveform 322 begins, second divider ratio is 32.

Fourth waveform 324 from the top shows frequency of Base Clock for one example. Here, the lower flat region of Base Clock is 100 MHz which is slowly ramped up in the first saw-tooth to 112.6 MHz. In the second saw-tooth, the Base Clock frequency reaches 116.2 MHz. As Base Clock frequency increases, I/O PLL 108 clock frequency may increase because it receives Base Clock as a reference clock. In such an embodiment, I/O PLL 108 remains locked and continues to provide higher frequency.

Figure 3C:
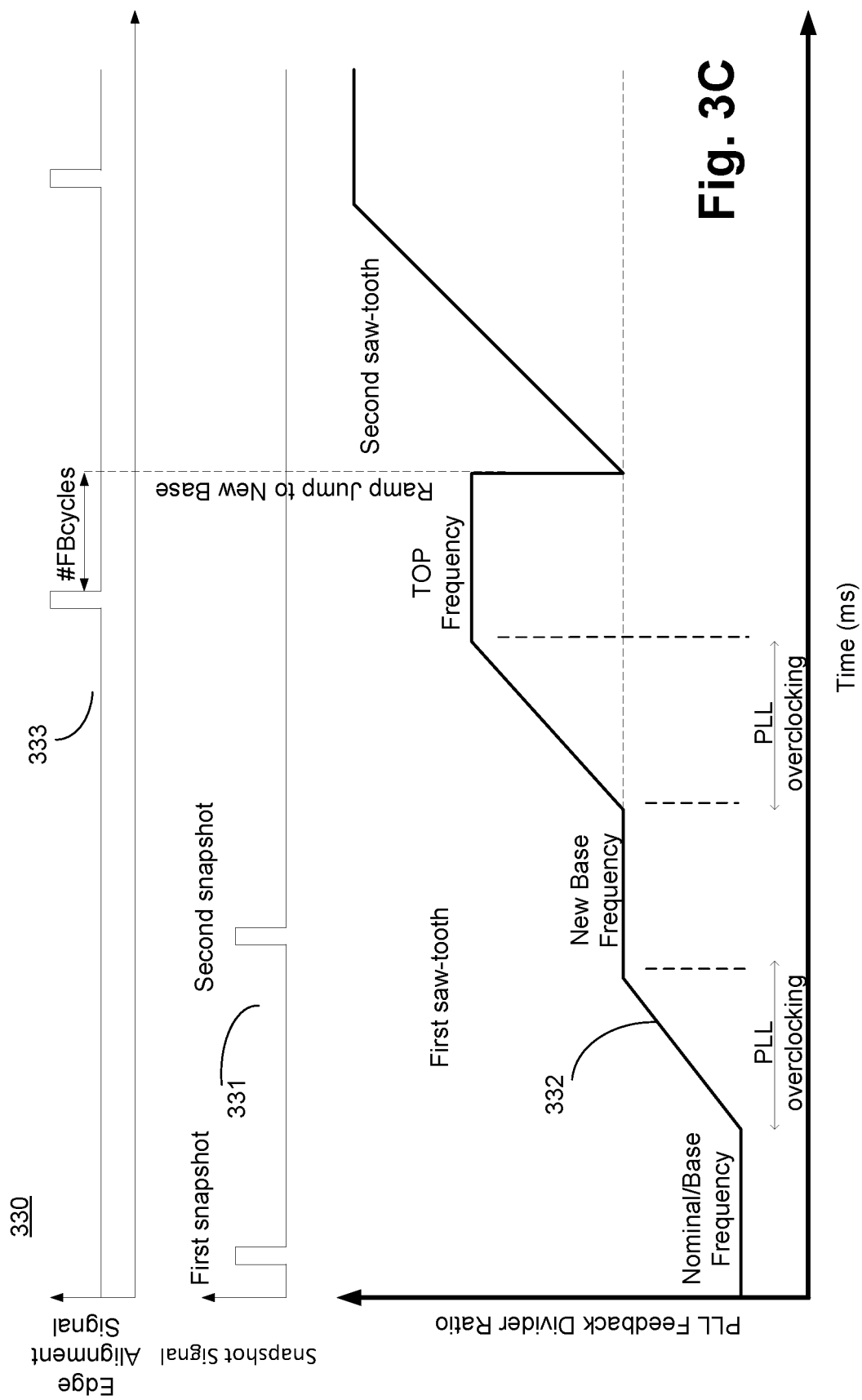
FIG. 3C illustrates a plot showing profile of DCO of FIG. 2 during over-clocking of Base Clock and Ramp-Jump for frequency range extension of the Base Clock, according to another embodiment of the disclosure.

FIG. 3C illustrates a plot 330 showing profile of DCO of FIG. 2 during over-clocking of Base Clock and Ramp-Jump for frequency range extension of the Base Clock, according to another embodiment of the disclosure. It is pointed out that those elements of FIG. 3C having the same reference numbers (or names) as the elements of any other figure can operate or function in any manner similar to that described, but are not limited to such.

Plot 330 shows three waveforms—331 to 333. Waveform 331 is the snapshot signal, waveform 332 is the first divider ratio, and waveform 333 is the edge alignment signal. Waveform 333 is same as waveform 321 of FIG. 3A. In one embodiment, several snapshots of integral components can be taken at various frequency points of the DCO output frequency. Waveform 331 shows Control Logic 106 taking two snapshots. The first snapshot begins the process of over-clocking. In this snapshot the base or nominal frequency parameters of PLL 104 are saved by Control Logic 106.

After first divider ratio is slowly updated to reach a first target frequency region, the second snapshot begins the process of next level of over-clocking. In this embodiment, parameters of PLL 104 are saved again, this time the parameters being the parameters of PLL 104 associated with the first target frequency region. In one embodiment, the first divider ratio is updated by Control Logic 106 again to achieve a higher frequency for Output Clock. After some frequency ramp time, PLL 104 achieves a new TOP frequency region.

In one embodiment, edge detection circuit determines synchronization edge (i.e., pulse of waveform 333) which indicates when Fb Clock and Base Clock edges align. In such an embodiment, after predetermined number of Base Clock cycles, Control Logic 106 performs the frequency jump operation where the previously stored snapshot is reapplied to PLL 104 as discussed above. Compared to the embodiment of FIG. 3B, in this embodiment, the previously stored snapshot is the new base frequency parameters of PLL 104 which were stored when the second snapshot signal pulse was generated. In this embodiment, the second sawtooth starts ramping from a higher base frequency setting. In such an embodiment, further flexibility in choosing optimum combinations of DCO frequency and divider ratio can be achieved.

As a corollary, the embodiments can be used to dynamically under-clock (i.e., lower the frequency) and/or spread the frequency of the Base Clock within a wide range for power savings. The embodiments can also be used with ring-oscillator (and other types) of PLLs for range extension.

As both feedback clock and post-divider clock are generated from same DCO clock, there is a possibility to miss the edge detection when both are aligned due to clock path mismatches. To overcome this issue, in one embodiment, post-divider clock (data for first flip-flop) and two units delayed version of post-divider clock (data for second flip-flop) are flopped with one unit delayed version of feedback divider clock. Unit delay can be smaller than DCO clock period (combinational) or DCO period based, but close to the setup time of each flip-flop, according to one embodiment. It is expected that first flip-flop output to be one as it meets setup time, and second flip-flop output to be zero as two units delayed version of post-divider clock may not meet setup time, when both edges are aligned. By using this scheme, in one embodiment, edge alignment of both edges can be detected within a DCO clock period.

Figure 4:
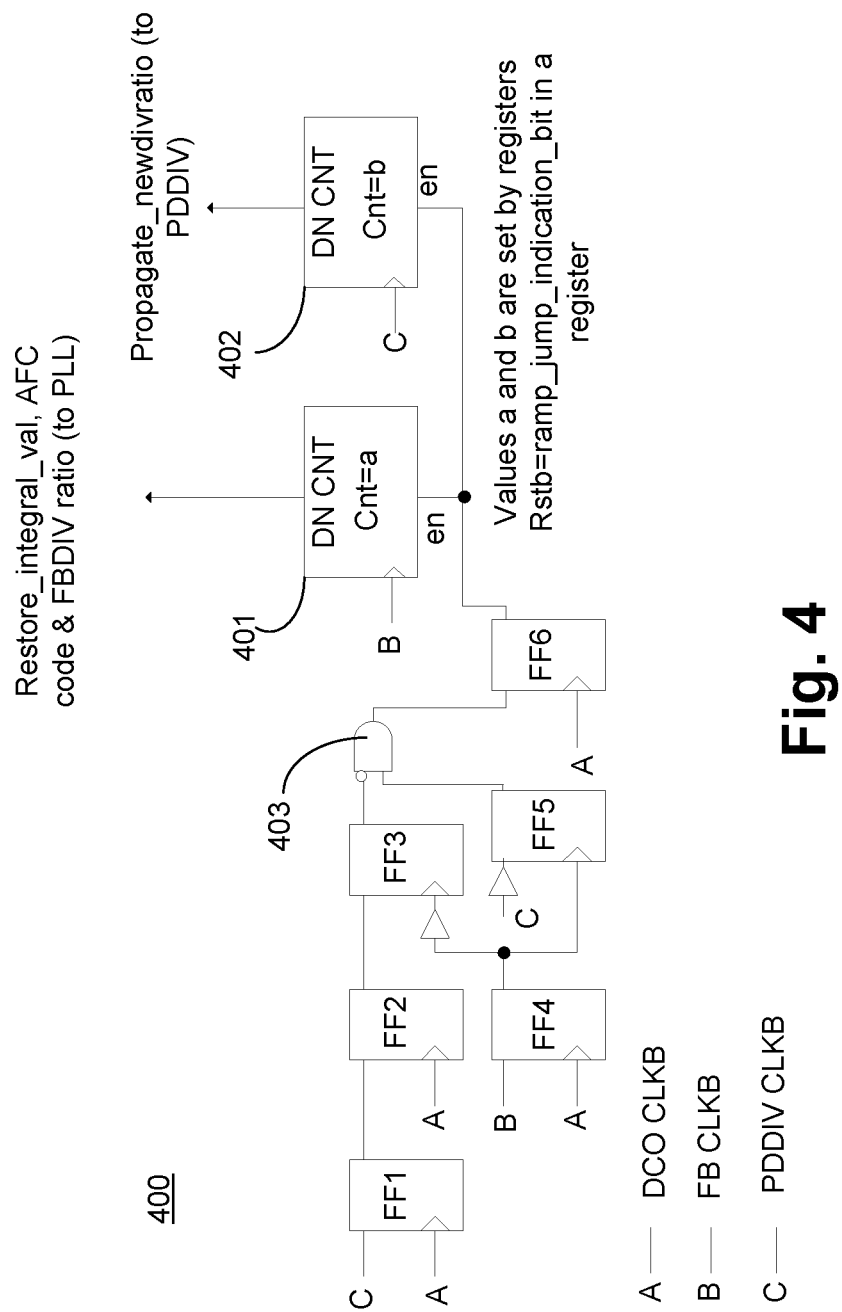
FIG. 4 illustrates an edge detection circuit, according to one embodiment of the disclosure.

FIG. 4 illustrates edge detection circuit 400, according to one embodiment of the disclosure. It is pointed out that those elements of FIG. 4 having the same reference numbers (or names) as the elements of any other figure can operate or function in any manner similar to that described, but are not limited to such.

In one embodiment, edge detection circuit 400 is part of Control Logic 106. In one embodiment, edge detection circuit 400 comprises six sequential units (e.g., flip-flops (FF)) FF1, FF2, FF3, FF4, FF5, and FF6, first counter 401, second counter 402, and logic gate 403. In one embodiment, first counter 401 is a down counter that counts to a value 'a' set in registers of Control Logic 106. In one embodiment, second counter 402 is a down counter that counts to a value 'b' set by in registers of Control Logic 106.

In one embodiment, clock signal to FF1, FF2, FF4, and FF6 is 'A,' which is DCO CLKB (i.e., an inverse of Output Clock signal from DCO 203). In one embodiment, data to FF1 is 'C,' which is PDDIV CLCKB (i.e., an inverse of Base Clock signal from Post Divider 105). In one embodiment, output of FF1 is received as data input to FF2, and output of FF2 is received as data input to FF3. In one embodiment, data to FF4 is 'B,' which is FB CLKB (i.e., an inverse of Fb Clock from Feedback Divider 204). In one embodiment, output of FF4 is input as clock signal for FF5 and FF3. In one embodiment, clock signal to FF3 is delayed by a buffer. In one embodiment, a buffered version of 'C' is provided as data input to FF5. In one embodiment, output of FF3 and FF5 are received by logic gate 403. In one embodiment, logic gate 403 performs an AND operation between an inverted version of output of FF3 and output of FF5. In one embodiment, output of logic gate 403 is provided to FF6 as data input. In one embodiment, output of FF6 generates enable signals (en) for first and second counters 401 and 402.

In one embodiment, first counter 401 receives 'B' as clock signal while second counter 402 receives 'C' as clock signal. In one embodiment output (i.e., Restore_integral_val (to PLL)) of first counter 401, when asserted, causes PLL 104 to re-apply the previously stored parameters. For example, after pulse 321 is generated, first counter 401 counts FBcycles1 and then generates Restore_integral_val signal which restores previously stored parameters for PLL 104.

In one embodiment, output (i.e., Propagate_newdivratio (to PDDIV)) of second counter 402, when asserted, causes PLL 104 to use new second divider ratio for Post Divider 105. For example, after pulse 321 is generated, second counter 402 counts FBcycles1 and then generates Propagate_newdivratio signal which updates second divider ratio for Post Divider 105. In one embodiment, the feedback and post dividers receive the same clock from oscillator (DCO). In one embodiment, as long as the first and second divider ratios have a greatest common factor of one, an oscillator edge can be found that generates the rising edge of both dividers' outputs. In such an embodiment, alignment between rising edges of feedback and post divider outputs can be detected.

Figure 5:
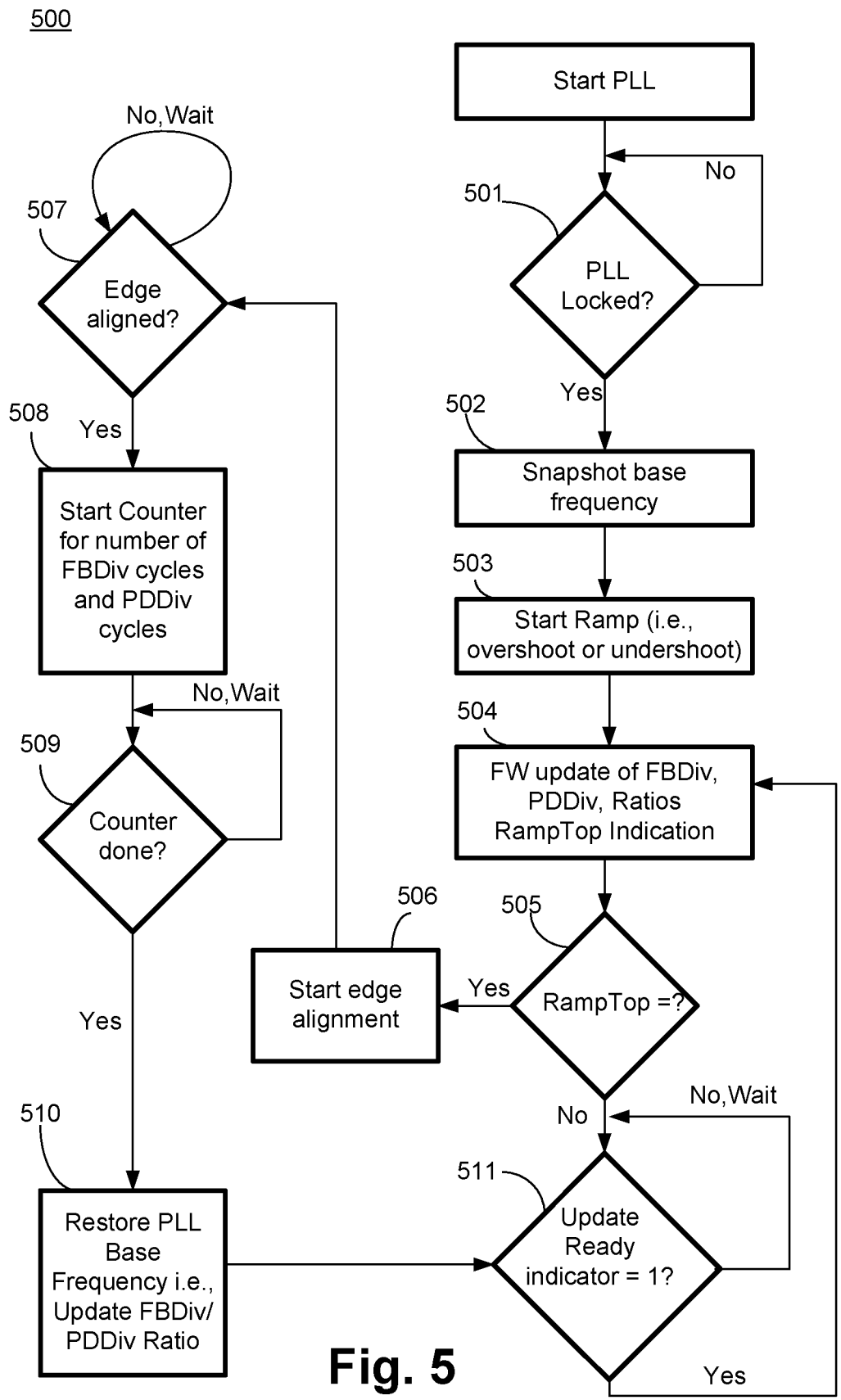
FIG. 5 illustrates a flowchart of a method performed by Control Logic of FIG. 1 for smooth over-clocking or under-clocking of Base Clock in a monotonic fashion without restarting the PLL, and for extending frequency range of the Base Clock, according to one embodiment of the disclosure.

FIG. 5 illustrates a flowchart 500 of a method performed by the control logic of FIG. 1 for smooth over-clocking or under-clocking of Base Clock in a monotonic fashion without restarting the PLL, and for extending frequency range of the Base Clock, according to one embodiment of the disclosure. It is pointed out that those elements of FIG. 5 having the same reference numbers (or names) as the elements of any other figure can operate or function in any manner similar to that described, but are not limited to such.

Although the blocks in the flowchart with reference to FIG. 5 are shown in a particular order, the order of the actions can be modified. Thus, the illustrated embodiments can be performed in a different order, and some actions/blocks may be performed in parallel. Some of the blocks and/or operations listed in FIG. 5 are optional in accordance with certain embodiments. The numbering of the blocks presented is for the sake of clarity and is not intended to prescribe an order of operations in which the various blocks must occur. Additionally, operations from the various flows may be utilized in a variety of combinations.

After PLL 104 starts, at block 501, a determination is made whether PLL 104 is locked. For a PLL which is locked, phase of Fb Clock is substantially aligned to phase of Ref Clock. If PLL 104 is not locked, the locking process continues, else process 500 proceeds to block 502. At block 502, Control Logic 106 stores or saves PLL 104 parameters (e.g., filter conditions such as coefficients, Code, etc.) associated with nominal PLL frequency lock. In one embodiment, Control Logic 106 stores or saves PLL 104 parameters in a register which are accessible by Operating System 101.

At block 503, Control Logic 106 receives indication from Operating System 101 to begin overshoot (i.e., over-clocking) or undershoot (i.e., under-clocking) of Base Clock. At block 504, Control Logic 106 updates first divider ratio to Feedback Divider (FBDiv) 204 to slowly change (i.e., increase) the frequency of Base Clock. After PLL 104 achieves the target Output Clock frequency, and hence the Base Clock frequency, Control Logic 106 adjusts the second divider ratio for Post Divider (PDDiv) 105.

After adjusting second divider ratio, Base Clock begins to ramp up in frequency towards the TOP. In one embodiment, at block 505 a determination is made whether TOP of ramp frequency has been achieved i.e., whether RampTop is achieved. If RampTop is achieved, then RampTop Indication is generated. In one embodiment, Control Logic 106 provides this indication to Operating System 101. At block 506, edge alignment process begins e.g., using circuits 400 and/or 420, as shown by waveform 321. At block 507, a determination is whether edges of Fb Clock and Base Clock are aligned. When the edges are aligned, a pulse is generated as shown by waveform 321.

At block 508, Counter 401 is started to count a number of cycles (# FBcycles1) of Feedback Divider 204 before the previously stored nominal values are re-applied to PLL 104. In one embodiment, Counter 402 is started to count a number of cycles (# PDcycles1) of Post Divider 105 before the previously stored nominal values are re-applied to PLL 104. At block 509, a determination is made whether Counter 401 and Counter 402 have completed their count to a predetermined programmable count value. If Counters 401 and 402 have not reached their predetermined programmable count values (i.e., values 'a' and 'b' respectively), process 500 remains at block 509. If Counters 401 and 402 reach their predetermined programmable count values, process 500 proceeds to block 510.

At block 510, Control Logic 106 re-applies the previously stored PLL parameters for base or nominal frequency. In this embodiment, first and second divide ratios are updated. At block 511, a determination is made whether Ready indicator is one or not. At block 511, when a determination is made that Ready indicator is a one, then Control Logic 106 updates the first and second divider ratios, along with stored snapshot of PLL AFC, integral values, so that Output Clock and hence the Base Clock increases in frequency. This time Base Clock reaches a higher TOP frequency as shown by second saw-tooth wave for waveform 322.

FIG. 6 illustrates a FW programming sequence 600 for Ramp-Jump over-clocking in which frequency range of the Base Clock is increased, according to one embodiment of the disclosure. It is pointed out that those elements of FIG. 6 having the same reference numbers (or names) as the elements of any other figure can operate or function in any manner similar to that described, but are not limited to such.

In this embodiment, FW programming sequence 600 is illustrated in a table format. The first row of the table includes: Sawtooth # (e.g., number of saw-tooth in waveforms 322 and 332), N_FBDIV_BASE (i.e., first divider ratio for base or nominal operation of PLL 104), N_PDDIV_BASE (i.e., second divider ratio for base or nominal operation), N_PDDIV_TOP (i.e., updated second divider ratio to reach TOP frequency region in saw-tooth waveforms 322 and 332), N_FBDIV_TOP (i.e., updated first divider ratio to reach TOP frequency region in saw-tooth waveforms 322 and 332), ROUND(N_FBDIV_TOP) (i.e., rounding of updated first divider ratio), Ideal PDDIV TOP O/P Frequency (MHz) (i.e., target output clock frequency, which equals the output clock frequency after jump, i.e. N_FBDIV_TOP*Fref/N_PDDIV_TOP), Actual PDDIV TOP O/P Frequency (MHz) (i.e., actual output clock frequency as result of rounding N_FBDIV_TOP), Period mismatch (ps) (i.e., difference between the time period of Actual output clock frequency and target output clock frequency), Ramp height DCO Frequency (MHz) (i.e., height of the saw tooth ramp in terms of output clock frequency), # FBDIV cycles (i.e., number of clock cycles in Feedback Divider 204) # PDDIV cycles (i.e., number of clock cycles in Post Divider 105), and Common Factor (i.e., Greatest common divisor between N_PDDVI_TOP and ROUND (N_FBDIV_TOP).

Figure 7:
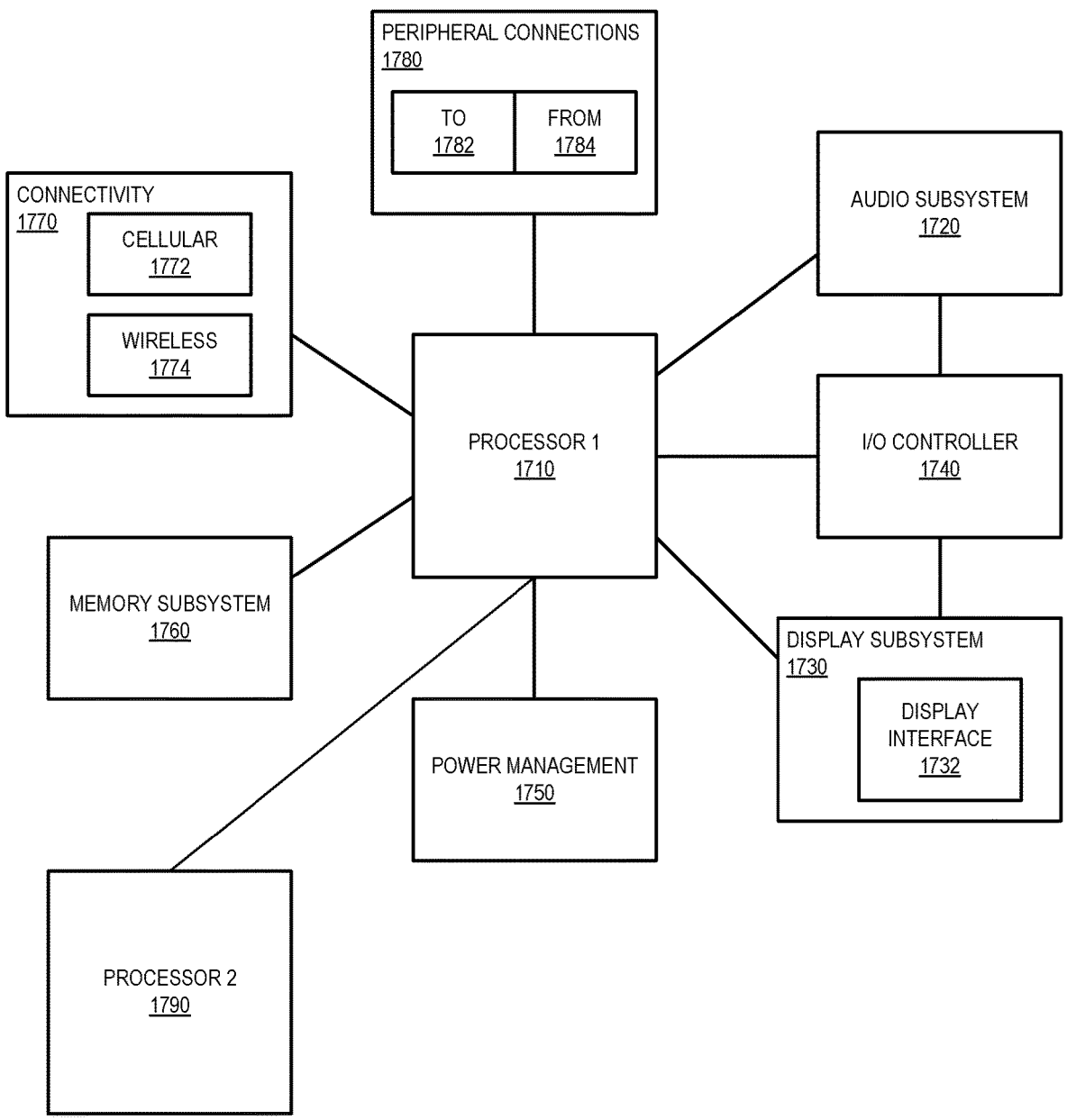
FIG. 7 is a smart device or a computer system or an SoC (System-on-Chip) with a PLL which is operable to be over-clocked or under-clocked in a monotonic fashion without restarting the PLL, according to one embodiment of the disclosure.

FIG. 7 is a smart device or a computer system or an SoC (system-on-chip) with a PLL which is operable to be over-clocked or under-clocked in a monotonic fashion without restarting the PLL, according to one embodiment of the disclosure. It is pointed out that those elements of FIG. 7 having the same reference numbers (or names) as the elements of any other figure can operate or function in any manner similar to that described, but are not limited to such.

FIG. 7 illustrates a block diagram of an embodiment of a mobile device in which flat surface interface connectors could be used. In one embodiment, computing device 1700 represents a mobile computing device, such as a computing tablet, a mobile phone or smart-phone, a wireless-enabled e-reader, or other wireless mobile device. It will be understood that certain components are shown generally, and not all components of such a device are shown in computing device 1700.

In one embodiment, computing device 1700 includes a first processor 1710 with a PLL which is operable to be over-clocked or under-clocked in a monotonic fashion without restarting the PLL described with reference to embodiments discussed. Other blocks of the computing device 1700 may also include a PLL which is operable to be over-clocked or under-clocked in a monotonic fashion without restarting the PLL described with reference to embodiments discussed. The various embodiments of the present disclosure may also comprise a network interface within 1770 such as a wireless interface so that a system embodiment may be incorporated into a wireless device, for example, cell phone or personal digital assistant.

In one embodiment, processor 1710 (and processor 1790) can include one or more physical devices, such as microprocessors, application processors, microcontrollers, programmable logic devices, or other processing means. The processing operations performed by processor 1710 include the execution of an operating platform or operating system on which applications and/or device functions are executed. The processing operations include operations related to I/O (input/output) with a human user or with other devices, operations related to power management, and/or operations related to connecting the computing device 1700 to another device. The processing operations may also include operations related to audio I/O and/or display I/O.

In one embodiment, computing device 1700 includes audio subsystem 1720, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1700, or connected to the computing device 1700. In one embodiment, a user interacts with the computing device 1700 by providing audio commands that are received and processed by processor 1710.

Display subsystem 1730 represents hardware (e.g., display devices) and software (e.g., drivers) components that provide a visual and/or tactile display for a user to interact with the computing device 1700. Display subsystem 1730 includes display interface 1732, which includes the particular screen or hardware device used to provide a display to a user. In one embodiment, display interface 1732 includes logic separate from processor 1710 to perform at least some processing related to the display. In one embodiment, display subsystem 1730 includes a touch screen (or touch pad) device that provides both output and input to a user.

I/O controller 1740 represents hardware devices and software components related to interaction with a user. I/O controller 1740 is operable to manage hardware that is part of audio subsystem 1720 and/or display subsystem 1730. Additionally, I/O controller 1740 illustrates a connection point for additional devices that connect to computing device 1700 through which a user might interact with the system. For example, devices that can be attached to the computing device 1700 might include microphone devices, speaker or stereo systems, video systems or other display devices, keyboard or keypad devices, or other I/O devices for use with specific applications such as card readers or other devices.

As mentioned above, I/O controller 1740 can interact with audio subsystem 1720 and/or display subsystem 1730. For example, input through a microphone or other audio device can provide input or commands for one or more applications or functions of the computing device 1700. Additionally, audio output can be provided instead of, or in addition to display output. In another example, if display subsystem 1730 includes a touch screen, the display device also acts as an input device, which can be at least partially managed by I/O controller 1740. There can also be additional buttons or switches on the computing device 1700 to provide I/O functions managed by I/O controller 1740.

In one embodiment, I/O controller 1740 manages devices such as accelerometers, cameras, light sensors or other environmental sensors, or other hardware that can be included in the computing device 1700. The input can be part of direct user interaction, as well as providing environmental input to the system to influence its operations (such as filtering for noise, adjusting displays for brightness detection, applying a flash for a camera, or other features).

In one embodiment, computing device 1700 includes power management 1750 that manages battery power usage, charging of the battery, and features related to power saving operation. Memory subsystem 1760 includes memory devices for storing information in computing device 1700. Memory can include nonvolatile (state does not change if power to the memory device is interrupted) and/or volatile (state is indeterminate if power to the memory device is interrupted) memory devices. Memory subsystem 1760 can store application data, user data, music, photos, documents, or other data, as well as system data (whether long-term or temporary) related to the execution of the applications and functions of the computing device 1700.

Elements of embodiments are also provided as a machine-readable medium (e.g., memory 1760) for storing the computer-executable instructions (e.g., instructions to implement any other processes discussed herein). The machine-readable medium (e.g., memory 1760) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1770 includes hardware devices (e.g., wireless and/or wired connectors and communication hardware) and software components (e.g., drivers, protocol stacks) to enable the computing device 1700 to communicate with external devices. The computing device 1700 could be separate devices, such as other computing devices, wireless access points or base stations, as well as peripherals such as headsets, printers, or other devices.

Connectivity 1770 can include multiple different types of connectivity. To generalize, the computing device 1700 is illustrated with cellular connectivity 1772 and wireless connectivity 1774. Cellular connectivity 1772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1774 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1780 include hardware interfaces and connectors, as well as software components (e.g., drivers, protocol stacks) to make peripheral connections. It will be understood that the computing device 1700 could both be a peripheral device ("to" 1782) to other computing devices, as well as have peripheral devices ("from" 1784) connected to it. The computing device 1700 commonly has a "docking" connector to connect to other computing devices for purposes such as managing (e.g., downloading and/or uploading, changing, synchronizing) content on computing device 1700. Additionally, a docking connector can allow computing device 1700 to connect to certain peripherals that allow the computing device 1700 to control content output, for example, to audiovisual or other systems.

In addition to a proprietary docking connector or other proprietary connection hardware, the computing device 1700 can make peripheral connections 1780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a locked loop having a feedback divider, the locked loop to receive a reference clock and to compare it with a feedback clock which is output from the feedback divider, and to generate an output clock; a post locked loop divider, coupled to the locked loop, to receive the output clock and to generate a base clock for other logic units; and a control logic to adjust first and second divider ratios for the feedback divider and the post locked loop divider respectively for over-clocking or under-clocking the base clock such that the locked loop remains locked while being over-clocked or under-clocked.

In one embodiment, the locked loop is one of a phase locked loop (PLL) or frequency locked loop (FLL). In one embodiment, the apparatus further comprises one or more registers to store code for controlling the oscillator when the PLL is locked. In one embodiment, the control logic is accessible by software or hardware. In one embodiment, the feedback divider is a fractional divider, and wherein the control unit is operable to adjust the first divider ratio to increase frequency of the output clock while maintaining lock for the PLL.

In one embodiment, the control logic is operable to maintain the second divider ratio for the post PLL divider while maintaining the first divider ratio. In one embodiment, the control logic to track the code and to update the first and second divider ratios. In one embodiment, the control logic to reapply the stored code for the PLL and to provide synchronized update for the first and second divider ratios to the feedback divider and the post PLL divider respectively. In one embodiment, the control unit to extend frequency range of the base clock. In one embodiment, the PLL further comprises a time-to-digital (TDC) unit to receive the reference clock and the feedback clock.

In one embodiment, the PLL further comprises a loop filter to filter output of the TDC. In one embodiment, the PLL further comprises an oscillator which is operable to oscillate according to an output of the loop filter, the oscillator to generate the output clock. In one embodiment, the oscillator is a digitally controlled oscillator (DCO). In one embodiment, the output clock of the oscillator is received by the feedback divider to generate the feedback clock.

In another example, a method is provided which comprises: locking a phase locked loop (PLL) to provide a base clock; storing a snapshot of codes or values associated with one or more components of the PLL when the PLL is locked; updating a first divider ratio of a feedback divider of the PLL while maintaining the PLL in locked state; and updating a second divider ratio of a post PLL divider while maintaining the first divider ratio. In one embodiment, the method further comprises: determining whether the base clock is operating at a predetermined top frequency. In one embodiment, the method further comprises determining when a feedback clock and the base clock are synchronized. In one embodiment, the method further comprises updating the first and second ratios when the feedback clock and the base clock are synchronized.

In another example, a system is provided which comprises: a memory unit; a process coupled to the memory unit, the processor operable to be over-clocked or under-clocked, the processor having an apparatus to the apparatus discussed above; and a wireless interface for allowing the processor to communicate with another device. In one embodiment, the system further comprises a display unit. In one embodiment, the display unit is a touch screen.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a clocking source to receive a reference clock and to generate an output clock; and
a control logic coupled to the clocking source, wherein the control logic is to adjust a divider ratio, for a divider of the clocking source, to adjust a frequency of the output clock such that a phase of the output clock remains locked relative to the reference clock while the control logic is to adjust the divider ratio.

2. The apparatus of claim 1, wherein the clocking source is one of a phase locked loop (PLL) or a frequency locked loop (FLL).

3. The apparatus of claim 1, wherein the control logic is to adjust the divider ratio slower than a bandwidth of the clocking source.

4. The apparatus of claim 1, wherein the clocking source is a first clocking source, and wherein the output clock is received as a reference clock by a second clocking source.

5. The apparatus of claim 4, wherein the control logic is to adjust the divider ratio of the first clock source such that the second clocking source does not lose a locked status.

6. The apparatus of claim 1, wherein the clocking source is phase locked prior to the control logic is to adjust the divider ratio.

7. The apparatus of claim 1, wherein the control logic is controllable by software.

8. The apparatus of claim 1, wherein the control logic is to save a code associated with an oscillator of the clocking source.

9. The apparatus of claim 1, wherein the control logic is to save coefficients of a digital filter of the clocking source.

10. The apparatus of claim 1, wherein the divider is a fractional divider.

11. An apparatus comprising:

a phase locked loop (PLL) having a divider, wherein the PLL is to receive a reference clock and to compare the reference clock with a feedback clock, wherein the feedback clock is output from the divider, and wherein the PLL is to generate an output clock; and a logic to adaptively adjust a divider ratio for the divider such that the PLL remains locked while being over-clocked or under-clocked.

12. The apparatus of claim 11, wherein the divider is a first divider, and wherein the apparatus comprising a second divider, coupled to the PLL, to receive the output clock and to generate a base clock for one or more logic units.

13. The apparatus of claim 12, wherein the PLL is a first PLL, wherein the one or more logic units includes a second PLL, and wherein the base clock is a reference clock of the second PLL.

14. The apparatus of claim 12, wherein the logic is to adaptively adjust divider ratio for the second divider such that the PLL remains locked while being over-clocked or under-clocked.

15. A system comprising:

a memory;

a processor coupled to the memory, wherein the processor includes:

a first phase locked loop (PLL) having a divider, wherein the first PLL is to receive a reference clock and to compare the reference clock with a feedback clock, wherein the feedback clock is output from the divider, and wherein the first PLL is to generate an output clock;

a second PLL to receive a version of the output clock; and a logic to adaptively adjust a divider ratio for the divider such that the first PLL remains locked while the logic is to adjust the divider ratio; and a connectivity interface coupled to the processor.

16. The system of claim 15, wherein the logic is to adjust the divider ratio slower than a bandwidth of the first PLL.

17. The system of claim 15, wherein the logic is to adjust the divider ratio of the first PLL such that the second PLL does not lose a locked status.

18. The system of claim 15, wherein the first PLL is phase locked prior to the logic is to adjust the divider ratio.

19. The system of claim 15, wherein the logic is controllable by software.

20. The system of claim 15, wherein the logic is to save a code associated with an oscillator of the first PLL.

* * * * *